United States Patent
Liu et al.

(10) Patent No.: US 7,045,429 B2
(45) Date of Patent: May 16, 2006

(54) METHOD OF MANUFACTURING A SEMICONDUCTOR DEVICE

(75) Inventors: Jin-Hua Liu, Yongin-si (KR); Hee-Sung Kang, Sungnam-si (KR); Choong-Ryul Ryou, Suwon-si (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 11/049,533

(22) Filed: Feb. 2, 2005

(65) Prior Publication Data
US 2005/0176207 A1 Aug. 11, 2005

(30) Foreign Application Priority Data
Feb. 5, 2004 (KR) .................... 10-2004-0007460

(51) Int. Cl.
*H01L 21/336* (2006.01)

(52) U.S. Cl. .................. 438/283; 438/156; 438/157; 438/176; 438/231; 438/596

(58) Field of Classification Search ............. 438/156, 438/157, 176, 231, 232, 283, 289, 302, 585, 438/588, 595, 596, 659, 766
See application file for complete search history.

(56) References Cited

U.S. PATENT DOCUMENTS
6,180,502 B1 1/2001 Liang .................... 438/585

FOREIGN PATENT DOCUMENTS
JP 9-252121 9/1997
KR 10-0221627 6/1999

OTHER PUBLICATIONS

Ghani, T., et al., "Asymmetric Source/Drain Extension Transistor Structure for High Performance Sub-50nm Gate Length CMOS Devices," 2001 Symposium on VLSI Technology Digest of Technical Papers, 2001.

*Primary Examiner*—Nathan J. Flynn
*Assistant Examiner*—Tan Tran
(74) *Attorney, Agent, or Firm*—Mills & Onello LLP

(57) ABSTRACT

In a method of manufacturing a semiconductor device, a device including gate electrodes and asymmetric source and drain regions is formed by employing a semiconductor layer structure. The short channel effect is prevented in the resulting device even though the gate electrodes are of a dimension on the order of nanometers. Additionally, the gate electrodes and asymmetric source and drain regions of the semiconductor device may be precisely formed to have dimensions on the nanometer scale because a semiconductor layer structure is used in the process for manufacturing the semiconductor device.

22 Claims, 20 Drawing Sheets

METHOD OF MANUFACTURING A SEMICONDUCTOR DEVICE

CROSS REFERENCE TO RELATED APPLICATION

This application claims priority under 35 USC § 119 to Korean Patent Application No. 2004-7460 filed on Feb. 5, 2004, the contents of which are incorporated herein by reference in their entirety.

BACKGROUND OF THE INVENTION

1. Field of the Invention

The present invention relates to a method of manufacturing a semiconductor device. More particularly, the present invention relates to a method of manufacturing a semiconductor device having asymmetric source/drain regions by employing a semiconductor layer having a mesa structure.

2. Description of the Related Art

As semiconductor devices continue to become more integrated to an ever-increasing degree, the area occupied by a unit memory cell of the semiconductor device is continuously reduced. For example, a metal oxide semiconductor field effect transistor (MOSFET) may include a gate electrode having dimensions on the order of nanometers. With this in mind, photolithography processes have been developed to precisely form a minute gate electrode using X-ray energy. However, such an apparatus for performing the photolithography process may have a complicated construction, and time and cost for manufacturing a MOSFET under these conditions may be considerably augmented. Additionally, when the minute gate electrode of the MOSFET is formed by the photolithography process, the MOSFET can be subject to a short channel effect such as a punch through phenomenon or a drain induced barrier lowering phenomenon although the MOSFET may have an increased saturation current ($I_{dsat}$) to improve a response speed thereof.

Considering the above-mentioned problem, a conventional transistor including asymmetric lightly doped source/drain regions is reported by "Asymmetric Source/Drain Extension Transistor Structure for High Performance Sub-50 nm Gate Length CMOS Device (2001 Symposium on VLSI Technology Digest of Technical Papers)." In the conventional transistor having the asymmetric lightly doped source/drain regions, because the lightly doped drain region has a length and a width respectively shorter and narrower than those of the lightly doped source region, the transistor has an increased saturation current ($I_{dsat}$) and also prevents or mitigates the occurrence of the short channel effect.

However, when the asymmetric source/drain regions of the transistor are formed at portions of a substrate by a tilted angle ion implantation process, an undesired offset region may be generated adjacent to the source/drain regions as follows.

FIG. 1 is a cross sectional view illustrating a conventional method of manufacturing a transistor that includes asymmetric lightly doped source/drain regions.

Referring to FIG. 1, a gate electrode 15 is formed on a semiconductor substrate 10. Impurities are implanted into portions of the substrate 10 adjacent to the gate electrode 15 by a perpendicular ion implantation process 20 and a tilted angle ion implantation process 25, thereby forming asymmetric lightly doped source and drain regions 30 and 35 at the portions of the substrate 10.

However, since the gate electrode 15 may obstruct implantations of impurities in the tilted angle ion implantation process 25, a serious offset region 40 may be formed at a portion of the substrate 10 between the gate electrode 15 and the lightly doped drain region 35, thereby causing the short channel effect in the transistor.

SUMMARY OF THE INVENTION

The present invention provides a method of forming a semiconductor device that prevents a short channel effect by employing a semiconductor layer having a mesa structure.

In accordance with one aspect of the present invention, there is provided a method of manufacturing a semiconductor device. In the method of manufacturing the semiconductor device, a semiconductor layer structure, for example in the shape of a mesa structure is formed on a substrate. After first spacers are formed on sidewalls of the semiconductor layer structure, gate electrodes are formed on sidewalls of the first spacers, respectively. Lightly doped source regions are formed at first portions of the substrate adjacent to the semiconductor layer structure by implanting first impurities into the first portions of the substrate using the semiconductor layer structure, the first spacers and the gate electrodes as masks. Halo regions are formed adjacent to the lightly doped source regions beneath the gate electrodes by implanting second impurities into second portions of the substrate beneath the gate electrodes using the semiconductor layer structure, the first spacers and the gate electrodes as masks. Second spacers are formed on sidewalls of the gate electrodes, respectively. Heavily doped source regions and a highly doped drain region are formed by implanting third impurities using the first spacers, the gate electrodes and the second spacers as masks. The heavily doped drain region is formed in the semiconductor layer structure and the heavily doped source regions are adjacent to the lightly doped source regions. A lightly doped drain region is formed beneath the semiconductor layer structure by thermally treating the substrate to diffuse the third impurities in the heavily doped drain region into the substrate.

An isolation pad may be formed on an end portion of the semiconductor layer structure together with the first spacers, and also a gate electrode pad may be formed on a portion of the isolation pad together with the gate electrodes. The thermal treatment of the substrate may be performed at a temperature of about 850 to about 1,050° C. for about 5 to about 200 seconds by a rapid thermal annealing (RTA) process.

When the first to the third impurities may include arsenic (As), boron (B) and arsenic (As), respectively, the first impurities may be implanted with a concentration of about $1.0 \times 10^{13}$ to about $1.0 \times 10^{15}$ atoms/cm² and an energy of below about 30 KeV. Additionally, the second impurities may be implanted with a concentration of about $1.0 \times 10^{13}$ to about $1.0 \times 10^{15}$ atoms/cm² and an energy of below about 30 KeV. Moreover, the third impurities may be implanted with a concentration of about $1.0 \times 10^{13}$ to about $1.0 \times 10^{15}$ atoms/cm$^2$ and an energy of about 1 to about 100 KeV.

When the first to the third impurities comprise boron fluoride (BF$_2$), arsenic (As) and boron (B), respectively, the first impurities may be implanted with a concentration of about $1.0 \times 10^{14}$ to about $1.0 \times 10^{16}$ atoms/cm$^2$ and an energy of below about 30 KeV, and the second impurities may be implanted with a concentration of about $1.0 \times 10^{13}$ to about $1.0 \times 10^{5}$ atoms/cm$^2$ and an energy of below about 100 KeV. Further, the third impurities may be implanted with a concentration of about $1.0 \times 10^{14}$ to about $1.0 \times 10^{16}$ atoms/cm$^2$ and an energy of about 1 to about 30 KeV.

In one embodiment of the present invention, after an insulation layer is formed on the substrate, an opening partially exposing the substrate is formed through the insulation layer by partially etching the insulation layer. Then, a single crystalline silicon layer is formed in the opening to fill up the opening on the insulation layer by a selective epitaxial growth (SEG) process. The single crystalline silicon layer may have a thickness of about 100 to about 10,000 Å. The SEG process may be carried out at a temperature of about 700 to about 900° C. under a pressure of about 5 to about 10 Torr using a chemical vapor deposition (CVD) chamber, a rapid thermal chemical vapor deposition (RTCVD) process chamber or an atomic layer deposition (ALD) chamber. After the insulation layer is removed using an etching solution including hydrogen fluoride, the semiconductor layer structure in the opening is completed on the substrate by planarizing the single crystalline silicon layer.

In another embodiment of the present invention, an insulation layer is formed on the substrate, and an opening partially exposing the substrate is formed through the insulation layer by partially etching the insulation layer. After a polysilicon layer formed on the insulation layer in the opening to fill up the opening, the semiconductor layer structure is completed on the substrate by planarizing the polysilicon layer. Finally, the insulation layer is removed using an etching solution including hydrogen fluoride.

According to the present invention, because a semiconductor device of the present invention includes gate electrodes and asymmetric source and drain regions by employing a semiconductor layer structure, the short channel effect is prevented in the resulting device even though the gate electrodes are of a dimension on the order of nanometers. Additionally, the gate electrodes and asymmetric source and drain regions of the semiconductor device may be precisely formed to have dimensions on the nanometer scale because the semiconductor layer structure is used in the process for manufacturing the semiconductor device.

BRIEF DESCRIPTION OF THE DRAWINGS

The above and other features and advantages of the present invention will become readily apparent by reference to the following detailed description when considered in conjunction with the accompanying drawings wherein:

FIGS. 3A to 3M are cross-sectional views illustrating a method of manufacturing the semiconductor device taken along line I–I' of FIG. 2;

DETAILED DESCRIPTION OF THE INVENTION

Figure 1:
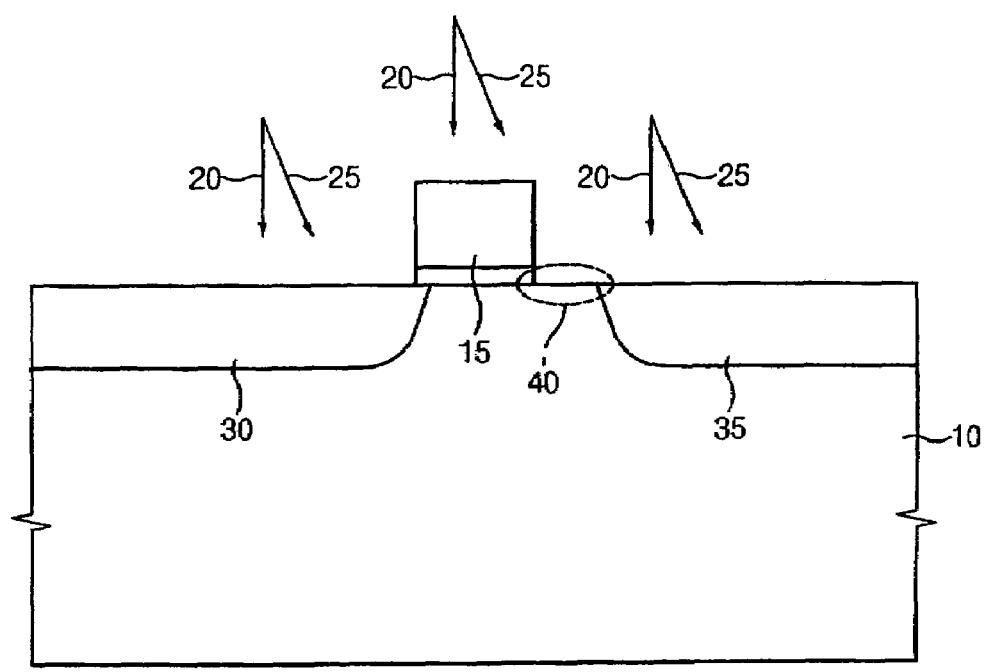
FIG. 1 is a cross sectional view illustrating a conventional method of manufacturing a transistor that includes asymmetric lightly doped source/drain regions.

The present invention will now be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element, or intervening elements may also be present.

Figure 2:
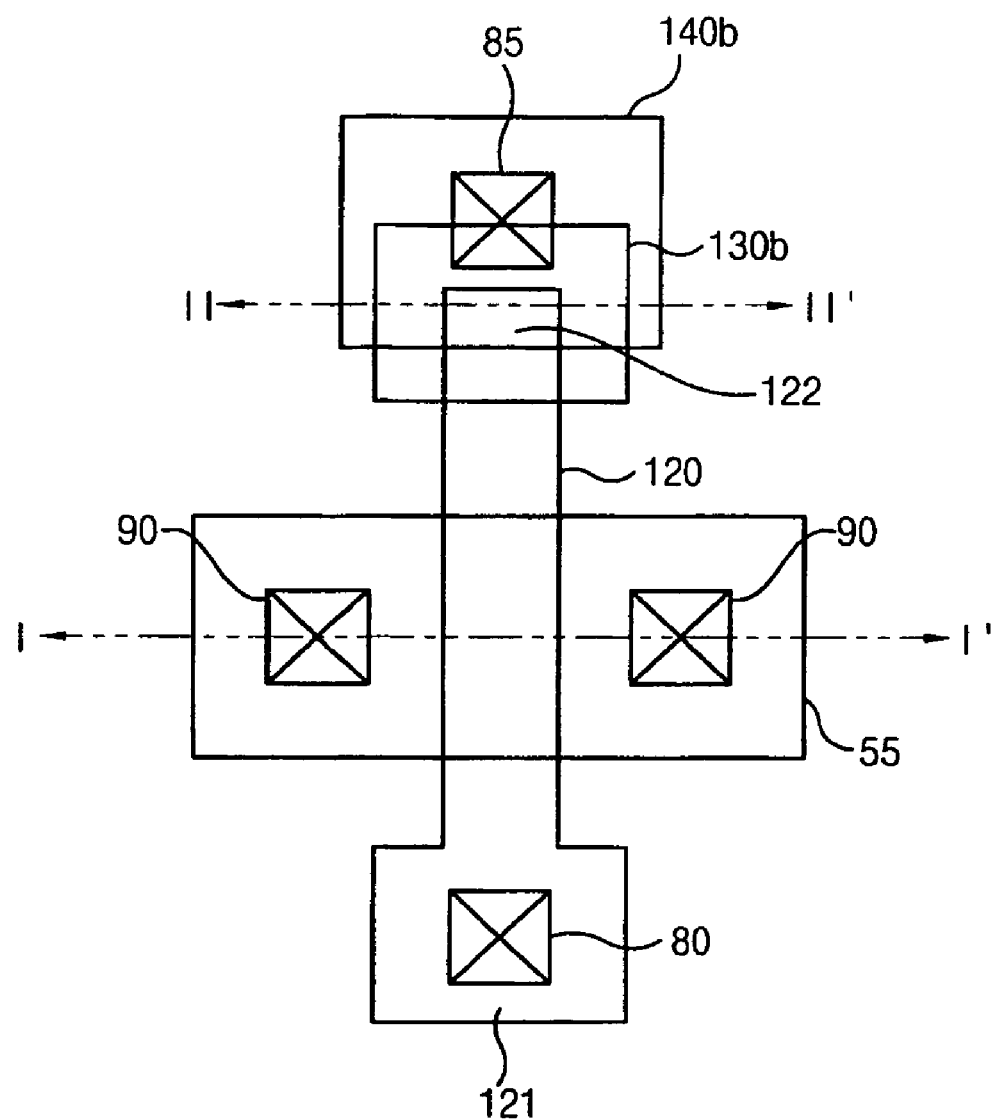
FIG. 2 is a plan view illustrating a semiconductor device in accordance with one embodiment of the present invention.

FIG. 2 is a plan view illustrating a semiconductor device in accordance with one embodiment of the present invention.

Referring to FIG. 2, an active area 55 is defined at a predetermined surface portion of a semiconductor substrate by forming an isolation layer on the semiconductor substrate.

A semiconductor layer 120 is formed on the semiconductor substrate along a first direction crossing the active area 55 that has a generally rectangular shape. For example, the semiconductor layer 120 includes a drain region having high impurity concentration. The semiconductor layer 120 includes a first end portion 121 enlarged along a second direction near the active area 55. The second direction may be perpendicular to the first direction. That is, the first end portion 121 of the semiconductor layer 120 is extended in a direction that is parallel to the active area 55.

An isolation pad 130b is formed on the semiconductor substrate to cover a second end portion 122 of the semiconductor layer 120. A gate electrode pad 140b partially covering the isolation pad 130b is formed on the semiconductor substrate. The gate electrode pad 140b does not contact the semiconductor layer 120 because the isolation pad 140b is interposed between the semiconductor layer 120 and the gate electrode pad 140b.

A drain contact hole 80 is formed to expose the first end portion 121 of the semiconductor layer 120 so that a metal wiring structure (not shown) makes contact with the semiconductor layer 120 through the drain contact hole 80.

A gate contact hole 85 is formed to expose the gate electrode pad 140b such that a metal wiring structure (not shown) makes contact with the gate electrode pad 140b through the gate contact hole 85.

Source contact holes 90 are formed to expose heavily doped source regions positioned in the active area 55 to electrically connect a metal wiring structure to the heavily doped source regions.

FIGS. 3A to 3M are cross-sectional views illustrating a method of manufacturing the semiconductor device taken along line I–I' of FIG. 2. FIGS. 4A to 4J are cross sectional views illustrating the method of manufacturing the semiconductor device taken along line II–II' of FIG. 2.

Figure 3A:
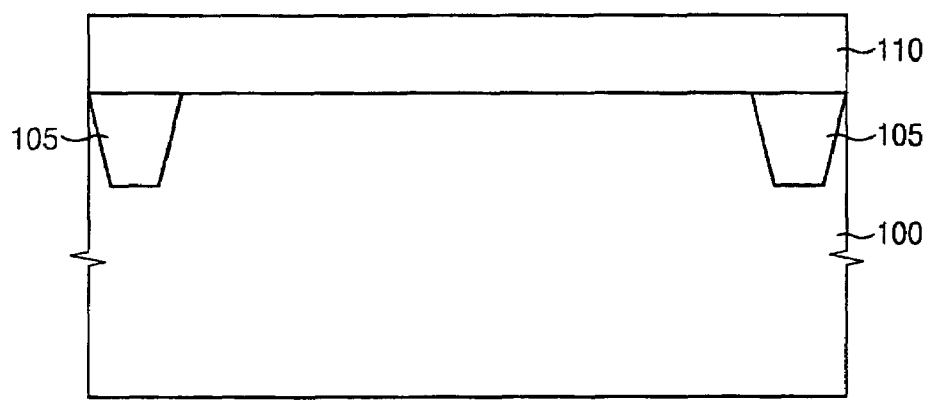
Figure 4A:
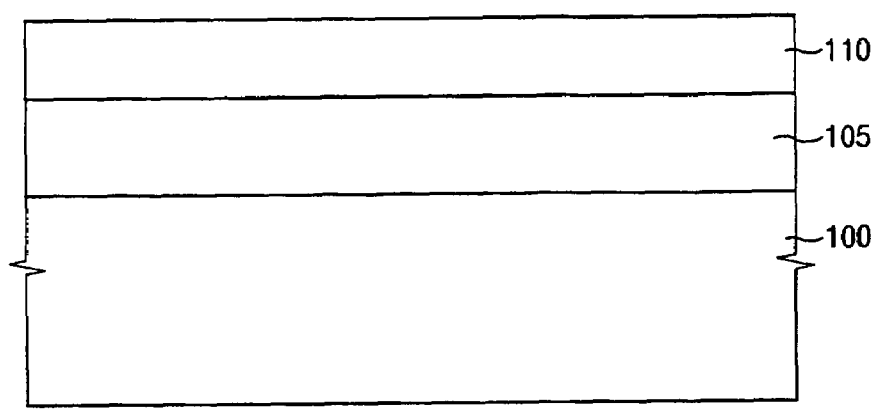
FIGS. 4A to 4J are cross-sectional views illustrating the method of manufacturing the semiconductor device of FIGS. 3A to 3M taken along line II–II' of FIG. 2.

Referring to FIGS. 3A and 4A, an isolation layer 105 is formed on a semiconductor substrate 100 to define an active area and a field area on the semiconductor substrate 100. The isolation layer 105 may be formed on the semiconductor substrate 100 by an isolation process such as a shallow trench isolation (STI) process or a local oxidation of silicon (LOCOS) process. The semiconductor substrate 100 comprises, for example, a P type silicon wafer.

A first oxide layer 110 is formed on the semiconductor substrate 100 having the isolation layer 105 formed thereon. The first oxide layer 110 may be formed by a chemical vapor deposition (CVD) process, a plasma enhanced-chemical vapor deposition (PE-CVD) process, a high density plasma-chemical vapor deposition (HDP-CVD) process, etc.

Figure 3B:
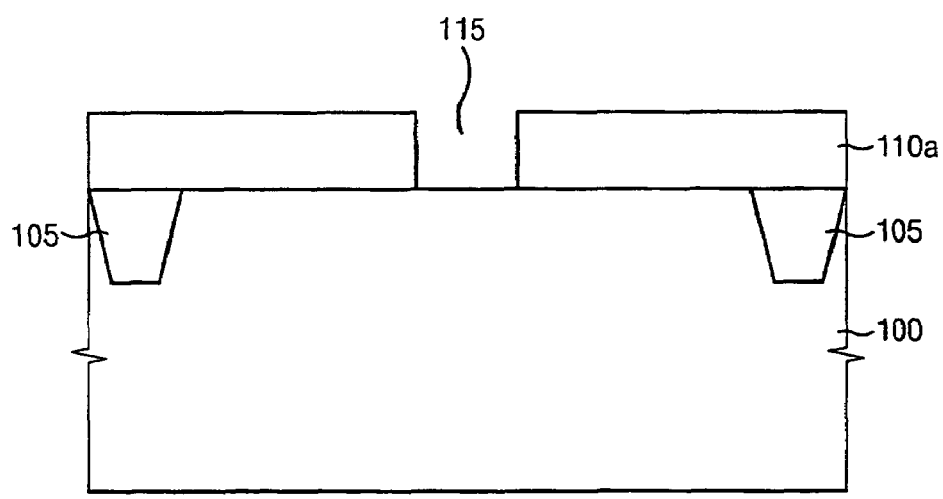
Figure 4B:
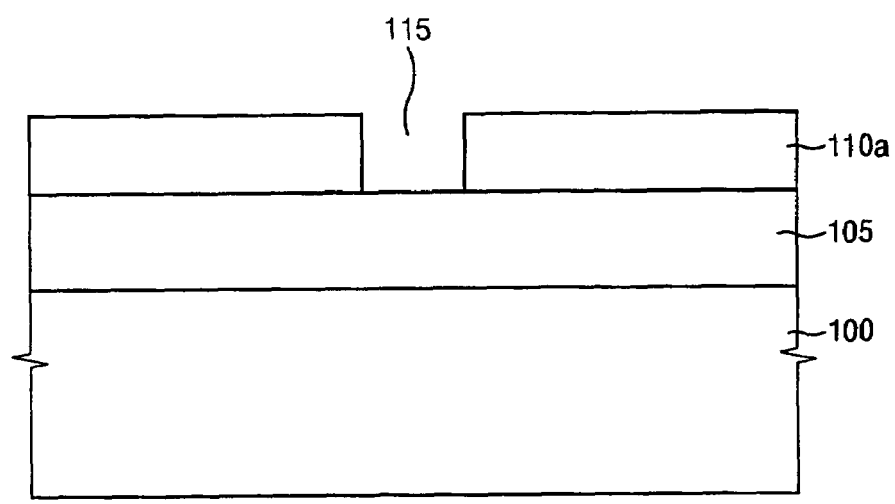

Referring to FIGS. 3B and 4B, the first oxide layer 110 is partially etched to form a first oxide layer pattern 110a on the semiconductor substrate 100 and the isolation layer 105. The first oxide layer pattern 110a has an opening 115 that exposes a portion of the semiconductor substrate 100. In one embodiment of the present invention, the first oxide layer pattern 110a may be formed by a photolithography process. That is, after a photoresist pattern is formed on the first oxide layer 110, the first oxide layer 110 is partially etched to form the first oxide layer pattern 110a having the opening 115. Optionally, an anti-reflective layer (ARL) may be formed between the first oxide layer 110 and the photoresist pattern to ensure a process margin of the photolithography process.

Figure 3C:
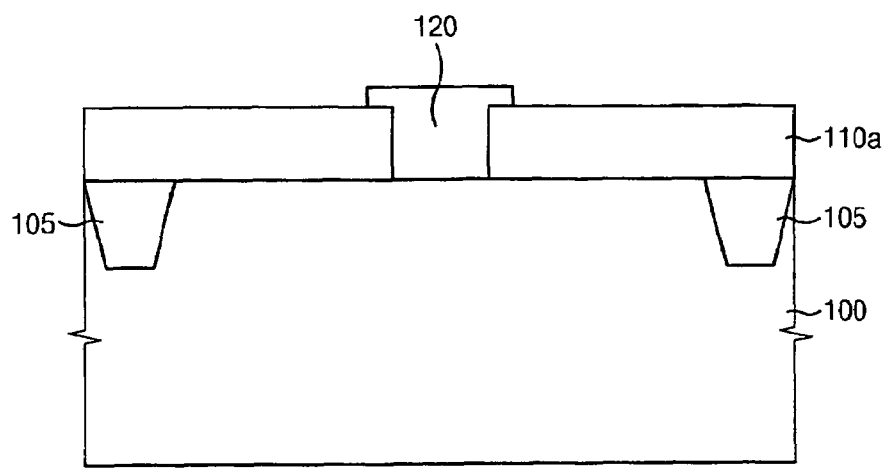
Figure 4C:
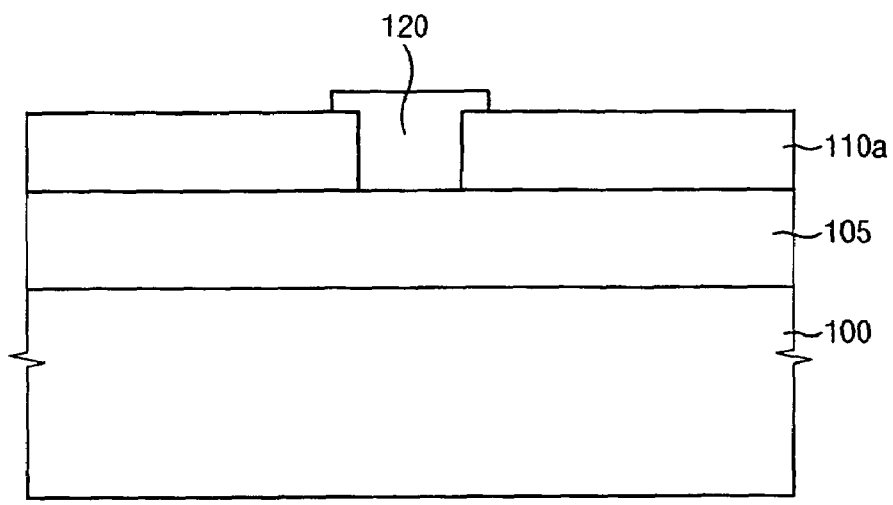

Referring to FIGS. 3C and 4C, a semiconductor layer 120 is formed from the exposed portion of the semiconductor substrate 100 to fill the opening 115 of the first oxide layer 110. The semiconductor layer 120 may be formed to fill the opening 115, for example, by a selective epitaxial growth (SEG) process. Thus, the semiconductor layer 120 includes single crystalline silicon in accordance with the substrate 100. Here, an upper portion of the semiconductor layer 120 partially covers the first oxide layer pattern 110a. The semiconductor layer 120 may have a thickness of about 100 Å to about 10,000 Å. The SEG process may be carried out at a temperature of about C 700 C to about 900 C under a pressure of about 5 Torr to about 10 Torr using a chemical vapor deposition (CVD) chamber, a rapid thermal chemical vapor deposition (RTCVD) process chamber or an atomic layer deposition (ALD) chamber.

Figure 3D:
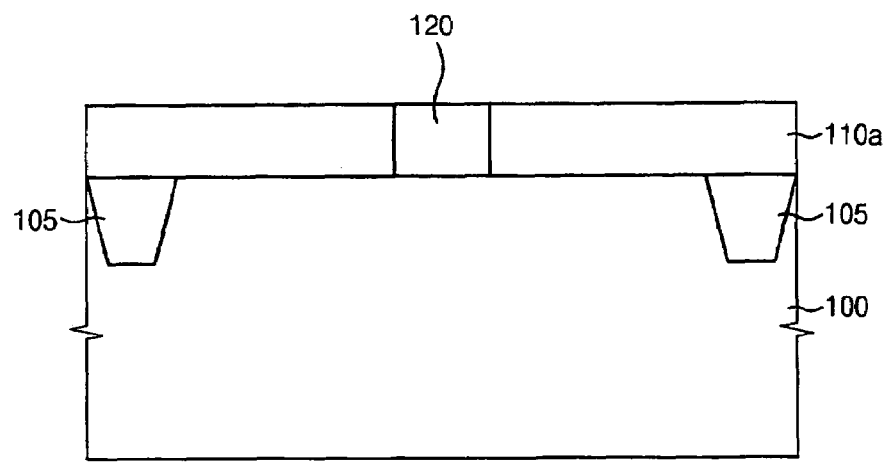
Figure 4D:
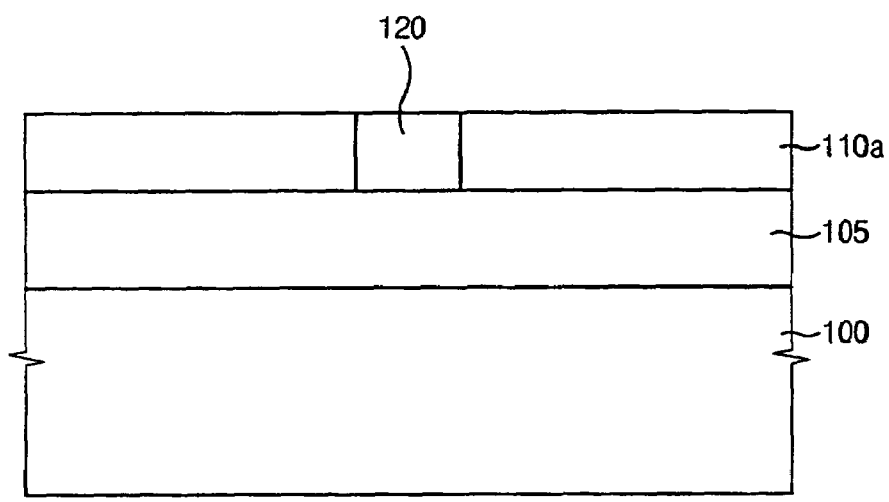

Referring to FIGS. 3D and 4D, the upper portion of the semiconductor layer 120 is removed by a planarizing process such as a chemical mechanical polishing (CMP) process, an etch back process or a combination process of CMP and etch back. Thus, the semiconductor layer 120 has a height substantially identical to that of the first oxide layer pattern 110a.

Figure 3E:
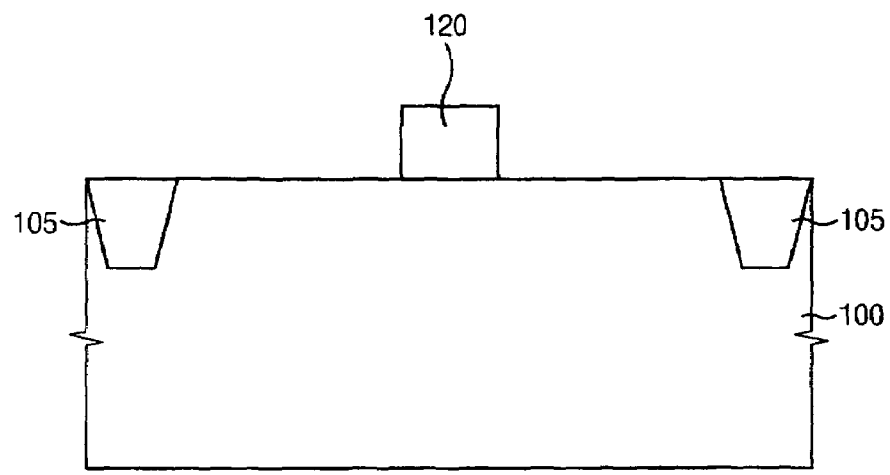
Figure 4E:
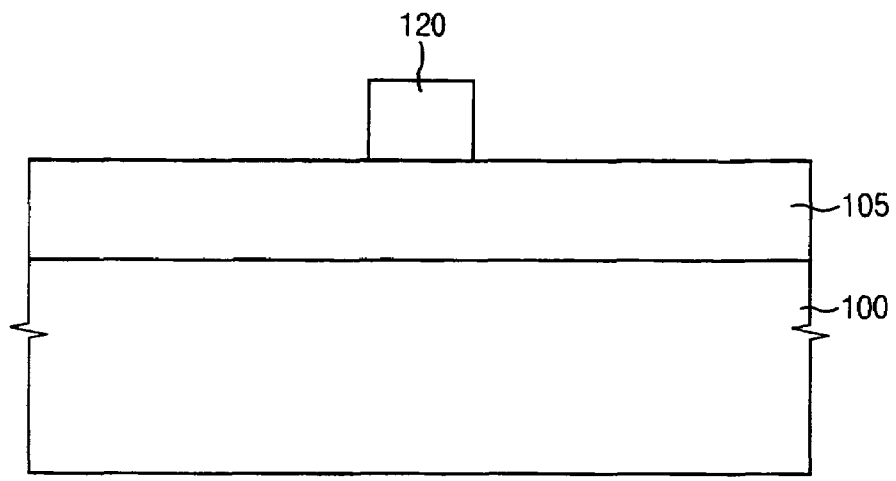

Referring to FIGS. 3E and 4E, the first oxide layer pattern 110a is removed from the substrate 100 by an etching process. For example, the first oxide layer pattern 110a is removed by a wet etching process using an etching solution that includes hydrogen fluoride (HF). As a result, the semiconductor layer 120 having a mesa structure is completed on the substrate 100 and the isolation layer 105.

Figure 3F:
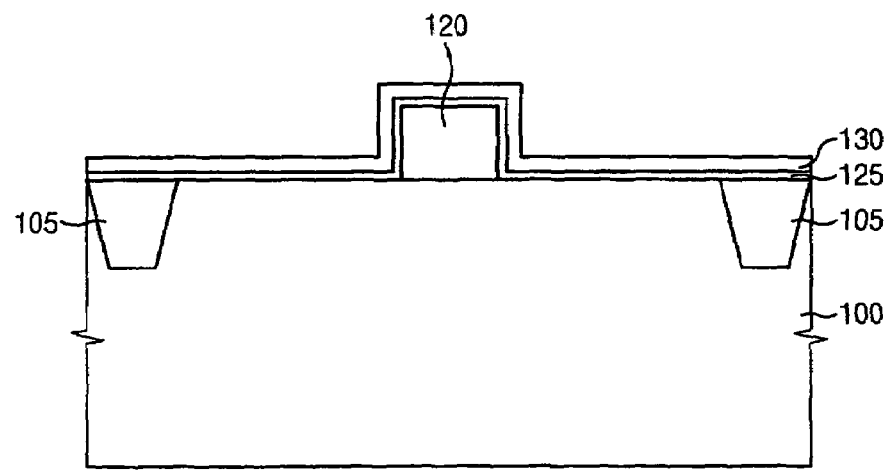
Figure 4F:
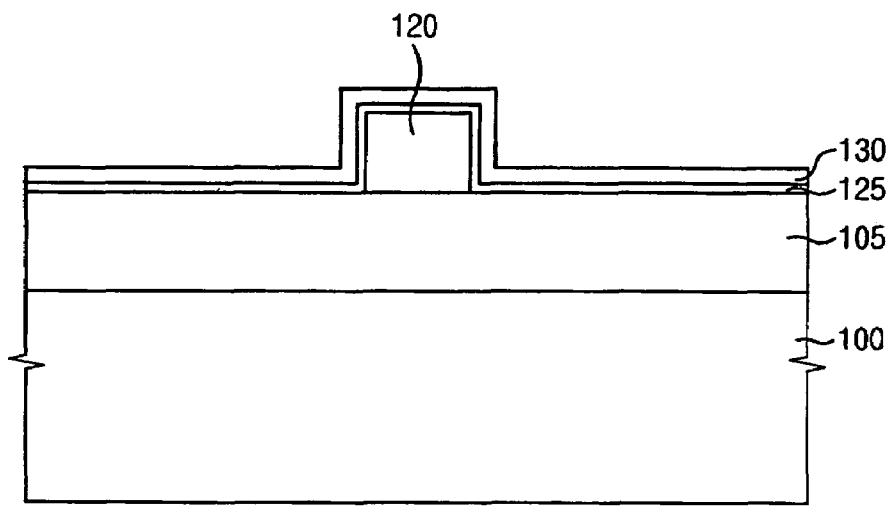

Referring to FIGS. 3F and 4F, a second oxide layer 125 and a first nitride layer 130 are sequentially formed on the substrate 100 to cover the semiconductor layer 120. The first nitride layer 130 may be formed using silicon nitride. Here, the isolation layer 105 is also covered with the second oxide layer 125 and the first nitride layer 130.

Figure 3G:
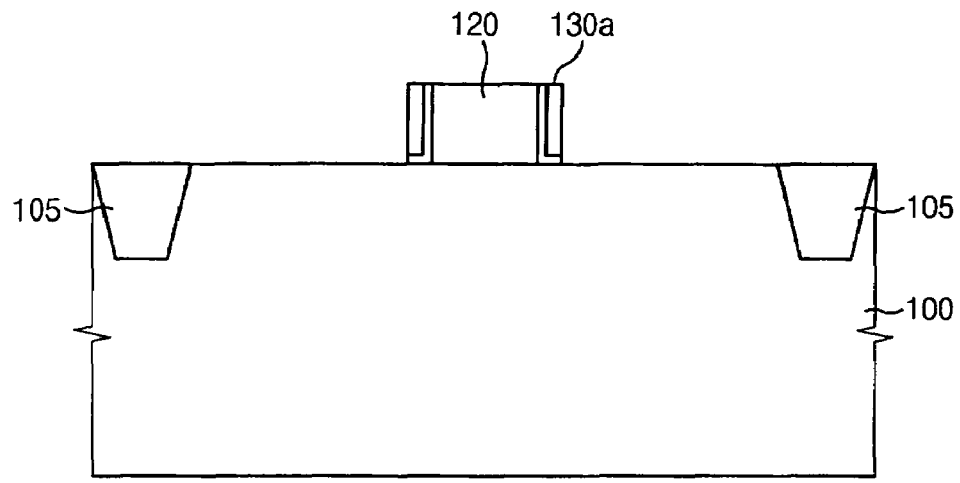
Figure 4G:
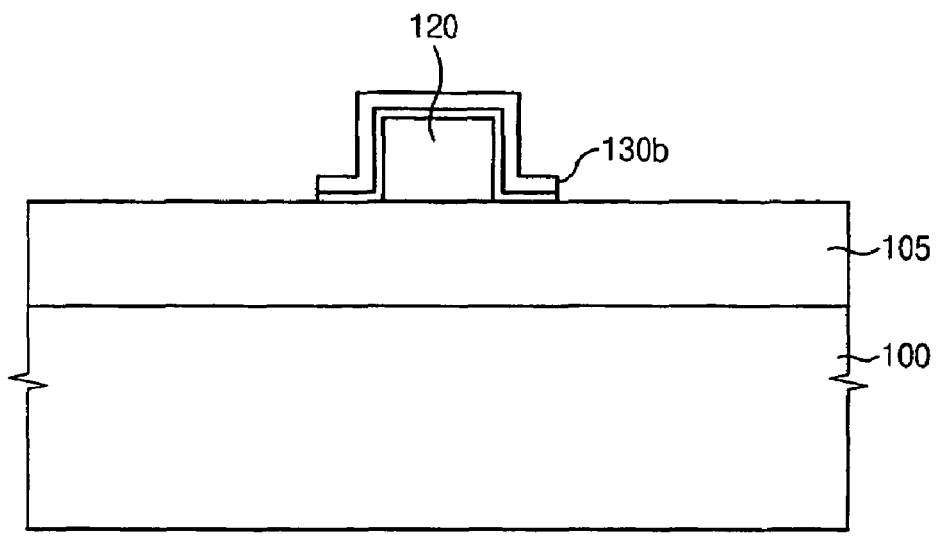

Referring to FIGS. 3G and 4G, a first photo resist pattern (not shown) is formed on the first nitride layer 130 to expose a portion of the semiconductor layer 120 in the active area 55 and the second end portion 122 of the semiconductor layer 120 as shown in FIG. 2. First spacers 130a are formed on sidewalls of the exposed portion of the semiconductor layer 120 in the active area 55. Simultaneously, an isolation pad 130b is formed to cover the second end portion 122 of the semiconductor layer 120. The first spacers 130a and the isolation pad 130b are formed by partially etching the first nitride layer 130 and the second oxide layer 125. The first spacers 130a electrically isolate the semiconductor layer 120 from gate electrodes 140a successively formed, thereby preventing an electrical short between the semiconductor layer 120 and the gate electrodes 140a. The isolation pad 130b also electrically isolates the second end portion 122 of the semiconductor layer 120 from a gate electrode pad 140b sequentially formed such that the isolation pad 130b prevents an electrical short between the semiconductor layer 120 and the gate electrode pad 140b. The first spacers 130a and the isolation pad 130b respectively have multi layer structures that includes second oxide layer patterns and first nitride layer patterns. Then, the first photoresist pattern is removed from the substrate 100 by an ashing process and/or a stripping process.

Figure 3H:
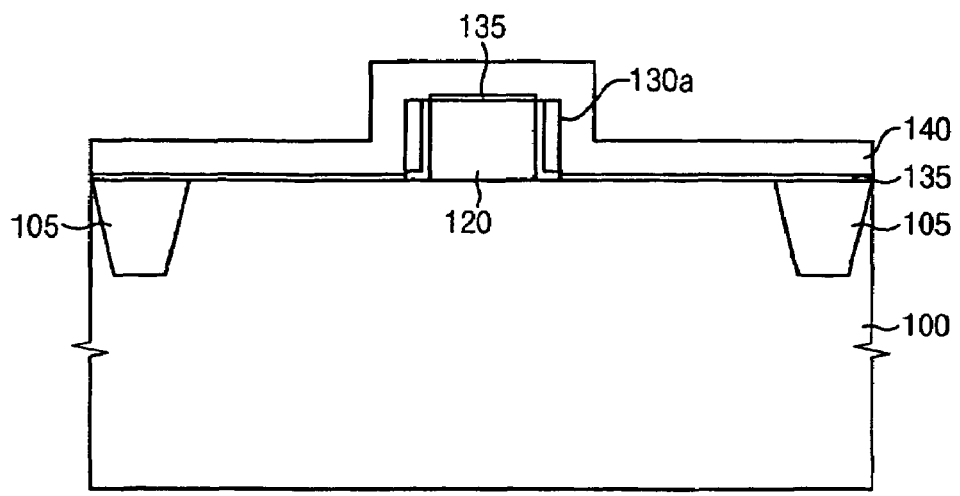
Figure 4H:
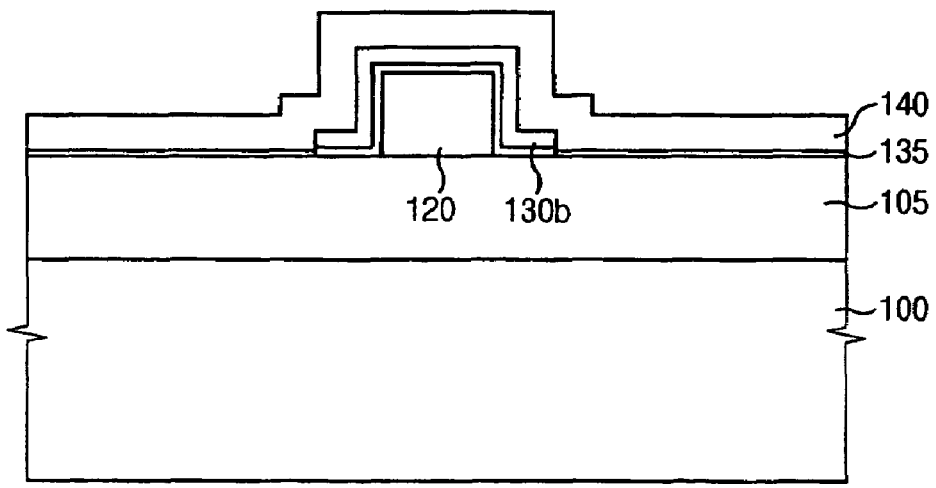

Referring to FIGS. 3H and 4H, a gate insulation layer 135 and a polysilicon layer 140 are successively formed on the substrate 100 to cover the semiconductor layer 120 having the first spacers 130a and to cover the isolation pad 130b. The gate insulation layer 135 may be formed using oxide. In the active area 55, the gate insulation layer 135 is formed on the semiconductor layer 120, the substrate 100, and the isolation layer 105. The polysilicon layer 140 covers the gate insulation layer 135 and the semiconductor layer 120 in the active area 55. However, in the field region, as shown in FIG. 4H, the gate insulation layer 135 is positioned on the isolation layer 105, and not on the isolation pad 130b. That is, the isolation pad 130b is not covered with the gate insulation layer 135. The polysilicon layer 140 covers the gate insulation layer 135 and the isolation pad 130b in the field region.

Figure 3I:
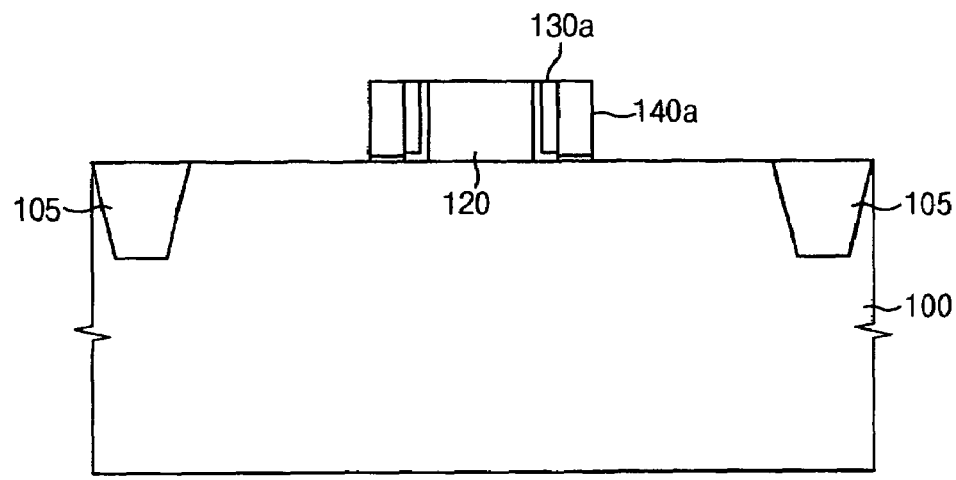
Figure 4I:
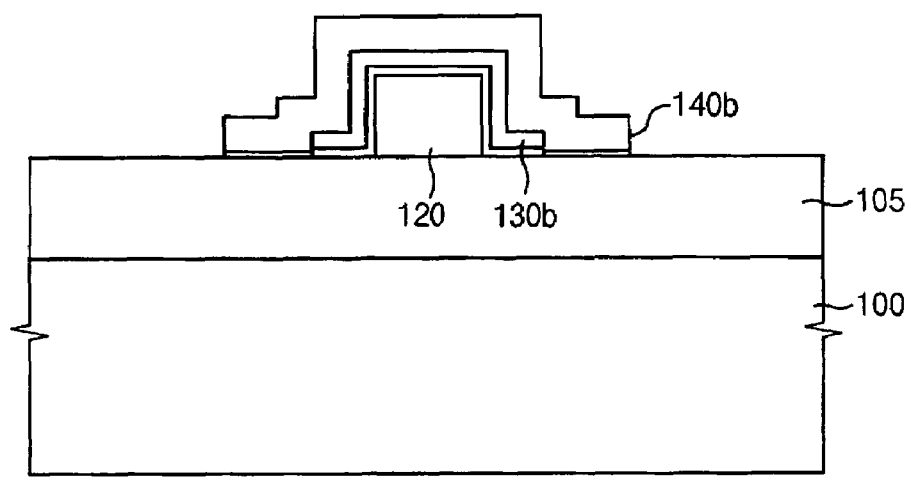

Referring to FIGS. 3I and 4I, a second photoresist pattern (not shown) is formed on the polysilicon layer 140 to expose portions of the polysilicon layer 140 where the first spacers 130a and the isolation pad 130b are positioned. The polysilicon layer 140 and the gate insulation layer 135 are partially etched using the second photoresist pattern as an etching mask, thereby forming the gate electrodes 140a and the gate electrode pad 140b. The gate electrodes 140a are formed on sidewalls of the first spacers 130a, respectively. Here, the gate insulation layer 135 positioned on the semiconductor layer 120 is simultaneously removed from the semiconductor layer 120. The gate electrode pad 140b covers the isolation pad 130b. Since the isolation pad 130b is interposed between the second end portion 122 of the semiconductor layer 120 and the gate electrode pad 140b, the gate electrode pad 140b does not make contact with the semiconductor layer 120. The second photoresist pattern is removed from the substrate 100 by an ashing and/or a stripping process.

Figure 3J:
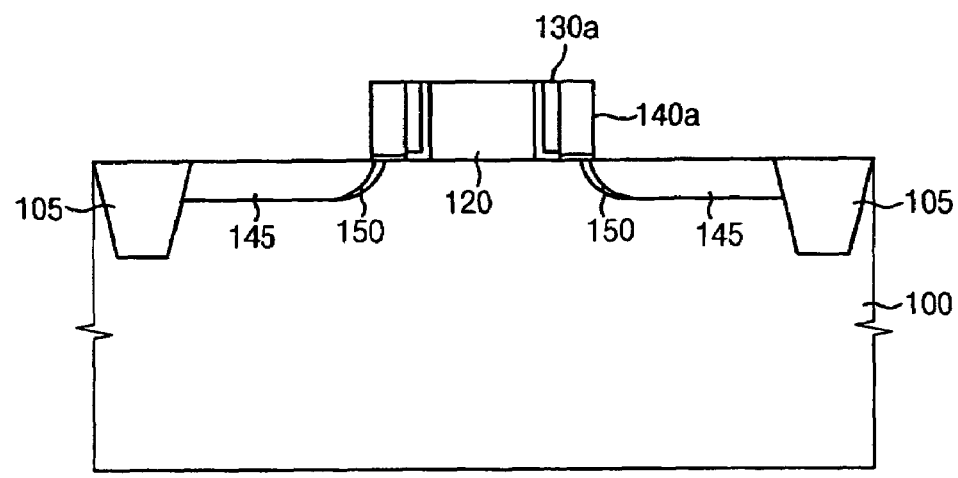

Referring to FIG. 3J, first impurities are implanted into portions of the substrate 100 with a relatively low concentration using the gate electrodes 130b and the semiconductor layer 120 as masks to thereby form lightly doped source regions 145 at the portions of the substrate 100. The first impurities may be implanted with a concentration of about $1.0 \times 10^{13}$ to about $1.0 \times 10^{15}$ atoms/cm$^2$ and an energy of below about 30 KeV. For example, the first impurities include arsenic (As).

Halo regions 150 are formed adjacent to the lightly doped source regions 145. Particularly, the halo regions 150 positioned beneath the gate electrodes 140a respectively make contact with the lightly doped source regions 145. The halo regions 150 are formed by implanting second impurities with a concentration of about $1.0 \times 10^{13}$ to about $1.0 \times 10^{15}$ atoms/cm$^2$ and an energy of about 1 to about 30 KeV. For example, the second impurities include boron (B).

Figure 3K:
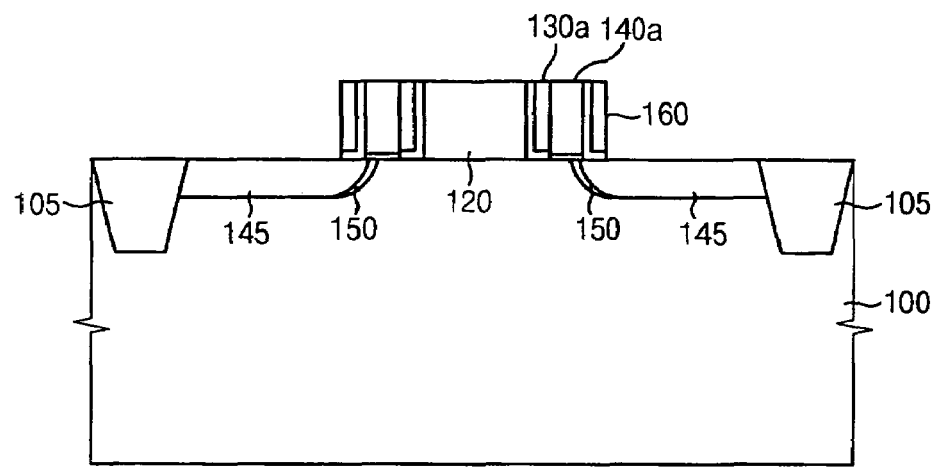
Figure 3I:
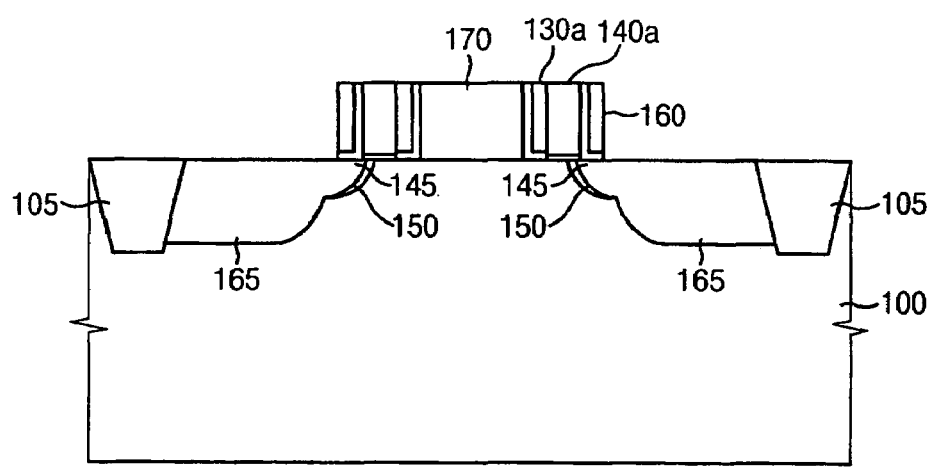
Figure 4J:
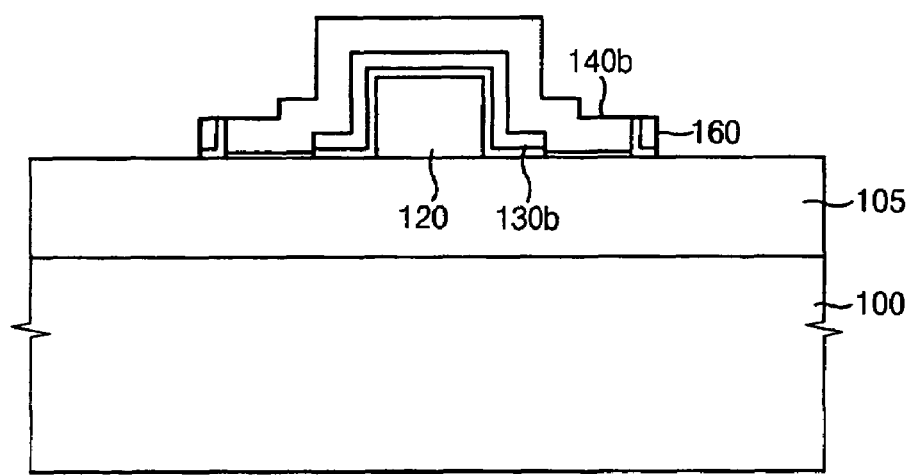

Referring to FIGS. 3K and 4J, a third oxide layer and a second nitride layer are sequentially formed on the substrate 100 to cover the resultant structures formed on the substrate 100. The second nitride layer may be formed using silicon nitride. Then, the second nitride layer and the third oxide layer are anisotropically etched to thereby form second spacers 160 on sidewalls of the gate electrodes 140a, respectively. At the same time, the second spacers 160 are formed on lower portions of the sidewalls of the gate electrode pads 140b. The second spacers 160 may have multi layer structures that include second nitride layer patterns and third oxide layer patterns.

Referring to FIG. 3L, third impurities are implanted into the semiconductor layer 120 and into the portions of the substrate 100 where the light doped source regions 145 are positioned. The third impurities are implanted with a relatively high concentration using the spacers 130a and 160 and the gate electrodes 140a as masks so that a heavily doped drain region 170 is formed in the semiconductor layer 120 and heavily doped source regions 165 are formed at the portions of the substrate 100. Thus, the lightly doped source regions 145 are positioned adjacent to the heavily doped source regions 165, respectively. The third impurities may be implanted with a concentration of about $1.0 \times 10^{13}$ to about $1.0 \times 10^{15}$ atoms/cm$^2$ and an energy of about 1 to about 30 KeV. For example, the third impurities include arsenic.

Figure 3M:
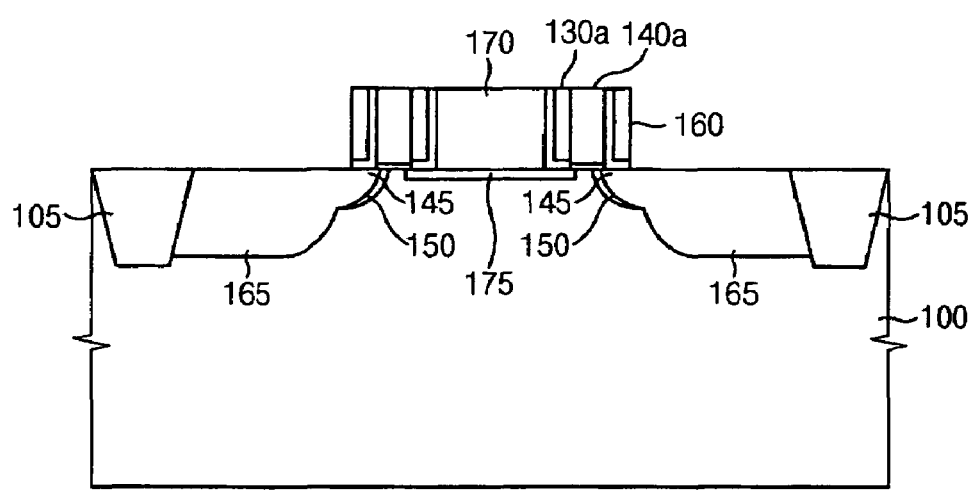

Referring to FIG. 3M, the substrate 100 having the resultant structures formed thereon is thermally treated so that the third impurities are diffused into a portion of the substrate 100 beneath the semiconductor layer 120. As a result, a light doped drain region 175 is formed at the portion of the substrate 100 beneath the semiconductor layer 120. The substrate 100 can be thermally treated by a rapid thermal annealing (RTA) process. Here, the substrate 100 can be treated at a temperature of about 850 to about 1,050° C. for about 5 to about 200 seconds.

Therefore, an N type metal oxide semiconductor (NMOS) transistor is formed on the substrate 100. The NMOS transistor of the present invention includes the semiconductor layer 120 having the mesa structure, the gate electrodes 140a and asymmetric source and drain regions 145, 150, 165, and 175.

FIGS. 5A to 5D are cross sectional views illustrating a method of manufacturing a semiconductor device in accordance with another embodiment of the present invention.

Figure 5A:
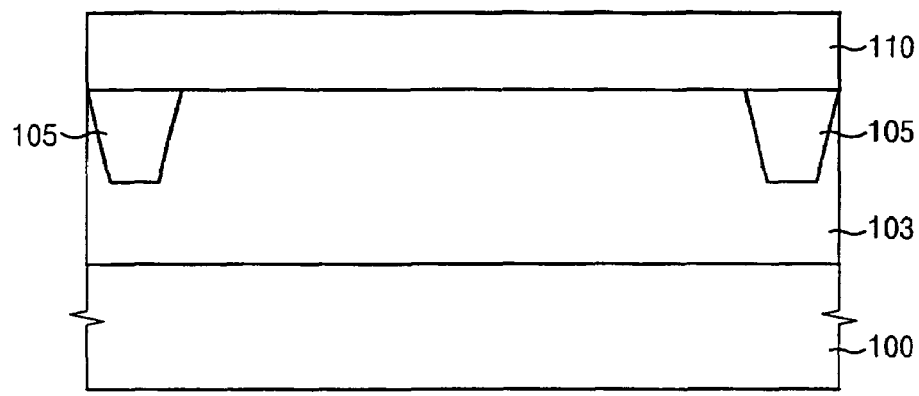
FIGS. 5A to 5D are cross-sectional views illustrating a method of manufacturing a semiconductor device in accordance with another embodiment of the present invention.

Referring to FIG. 5A, first impurities are implanted into a semiconductor substrate 100 so that an N type well 103 is formed on the semiconductor substrate 100. The semiconductor substrate 100 may include a P type silicon substrate. An active area and a field area are defined on the semiconductor substrate 100 in accordance with a formation of an isolation layer 105.

Figure 5B:
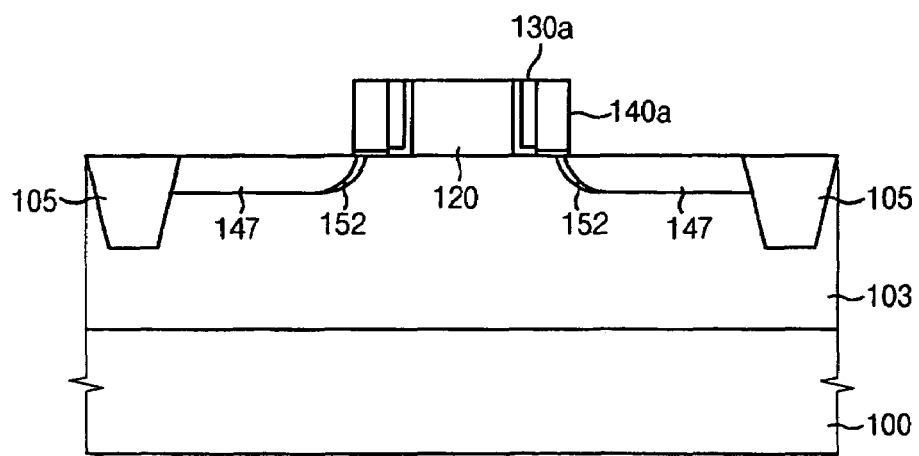

Referring to FIG. 5B, after a semiconductor layer 120, gate electrodes 140a and first spacers 130a are formed in the active area, lightly doped source regions 147 are formed in the active area using the semiconductor layer 120, the gate electrodes 140a and the first spacers 130a as masks. The lightly doped source regions 147 are formed by implanting second impurities into portions of the substrate 100 in the active area. The second impurities may be implanted with a concentration of about $1.0 \times 10^{14}$ to about $1.0 \times 10^{16}$ atoms/cm$^2$ and an energy of below about 30 KeV. The second impurities may include boron fluoride (BF$_2$).

Third impurities are implanted into portions of the substrate 100 adjacent to the lightly doped source regions 147 so that halo regions 152 are formed adjacent to the lightly doped source regions 147. The halo regions 147 are positioned beneath the gate electrodes 140a, respectively. The third impurities may be implanted with a concentration of about $1.0 \times 10^{13}$ to about $1.0 \times 10^{15}$ atoms/cm$^2$ and an energy of below about 100 KeV. The third impurities may include arsenic.

Figure 5C:
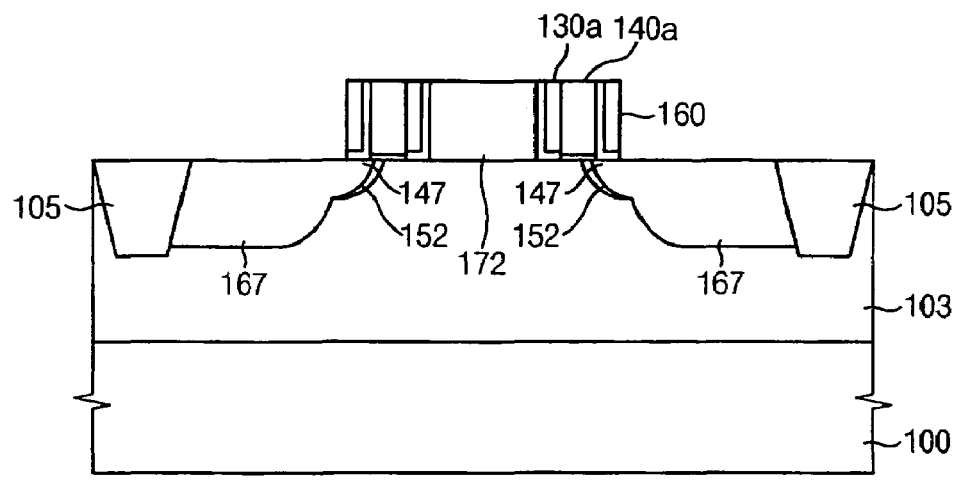

Referring to FIG. 5C, fourth impurities are implanted into the semiconductor layer 120 and the portions of the substrate 100 where the lightly doped source regions 147 are positioned so that a heavily doped drain region 172 is formed in the semiconductor layer 120 and heavily doped source regions 167 are simultaneously formed at the portions of the substrate 100 where the lightly doped source regions 147 are positioned. The fourth impurities may be implanted with a concentration of about $1.0 \times 10^{14}$ to about $1.0 \times 10^{16}$ atoms/cm$^2$ and an energy of about 1 to about 30 KeV. The fourth impurities may include boron.

Figure 5D:
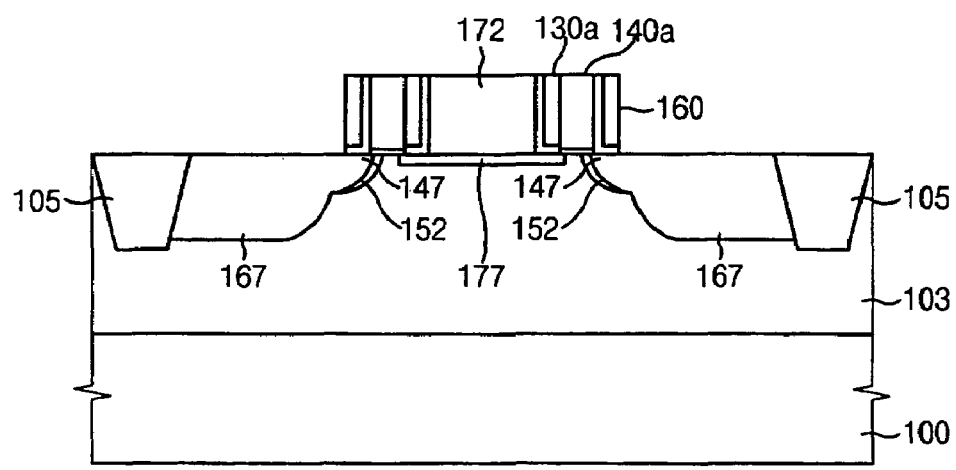

Referring to FIG. 5D, the substrate 100 having the resultant structures formed thereon is thermally treated such that a lightly doped drain region 177 is formed beneath the semiconductor layer 120 having the highly doped drain region 172. The substrate 100 may be treated at a temperature of about 850 to about 1,050° C. for about 5 to about 200 seconds.

As a result, a P type metal oxide semiconductor (PMOS) transistor is formed on the substrate 100. The PMOS transistor of the present invention includes the semiconductor layer 120 having a mesa structure, the gate electrodes 140a and asymmetric source and drain regions 147, 152, 167, 172 and 177.

FIGS. 6A to 6C and 7A to 7C are cross sectional views illustrating a method of manufacturing a semiconductor device in accordance with other embodiments of the present invention.

Figure 6A:
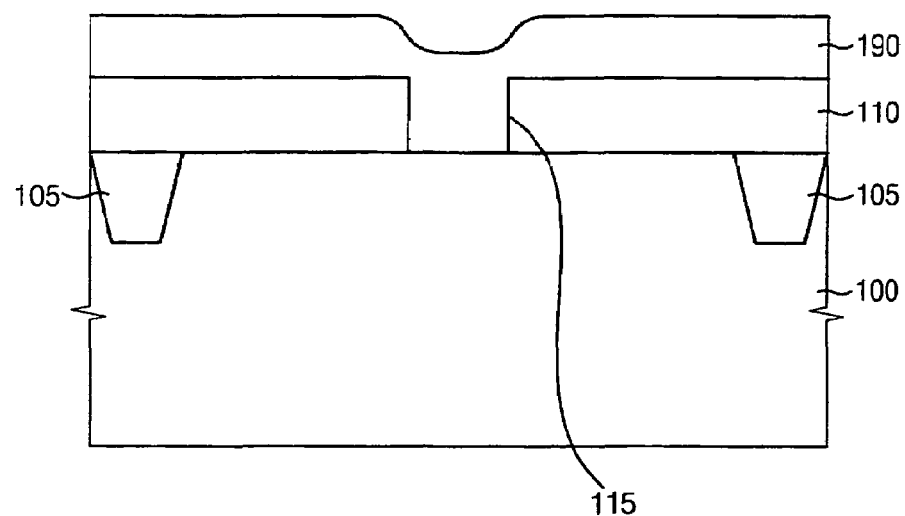
FIGS. 6A to 6C and 7A to 7C are cross sectional views illustrating a method of manufacturing a semiconductor device in accordance with other embodiments of the present invention.
Figure 7A:
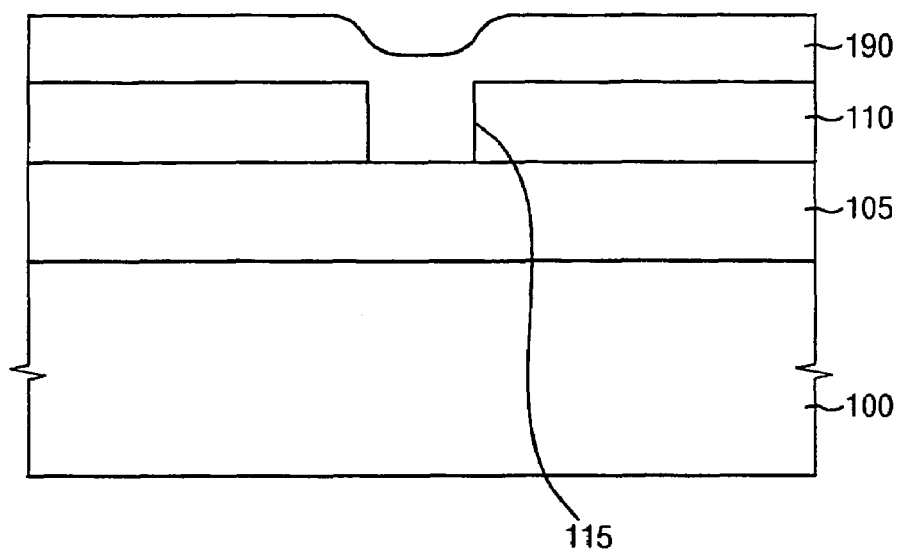

Referring to FIGS. 6A and 7A, an isolation layer 105 is formed on a semiconductor substrate 100 having a P type silicon wafer to define an active area and a field area on the semiconductor substrate 100. The isolation layer 105 may be formed on the substrate 100 by an isolation process such as an STI process or an LOCOS process. Alternatively, an N type well may be formed on the substrate 100 by implanting N type impurities into the substrate 100.

A first oxide layer 110 is formed on the substrate 100 having the isolation layer 105 formed thereon. The first oxide layer 110 is partially etched so that an opening 115 is formed through the first oxide layer 110 to expose a portion of the substrate 100.

A polysilicon layer 190 is formed on the first oxide layer 110 to fill up the opening 115. The polysilicon layer 190 may have a thickness of about 100 to about 1,000 Å. The polysilicon layer 190 may be formed at a temperature of about 700 to about 900° C. under a pressure of about 5 to about 10 Torr by a LPCVD process, an ALD or a rapid thermal chemical vapor deposition (RTCVD) process.

Figure 6B:
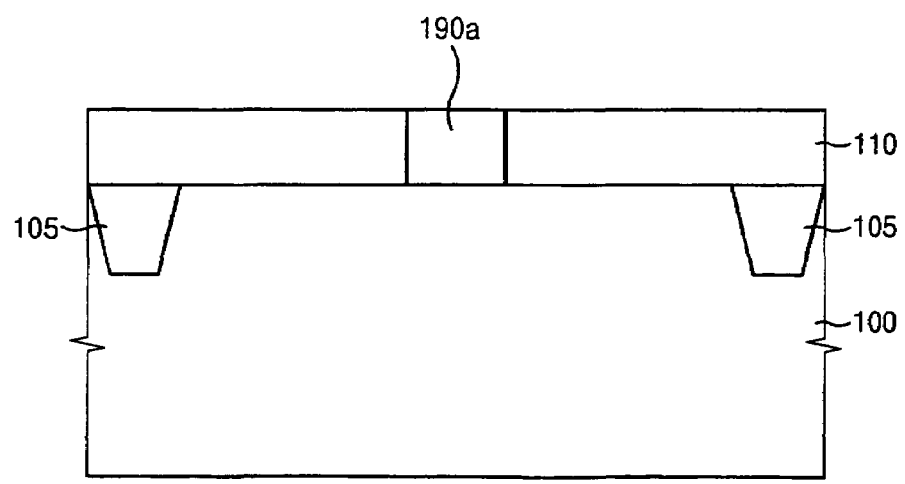
Figure 7B:
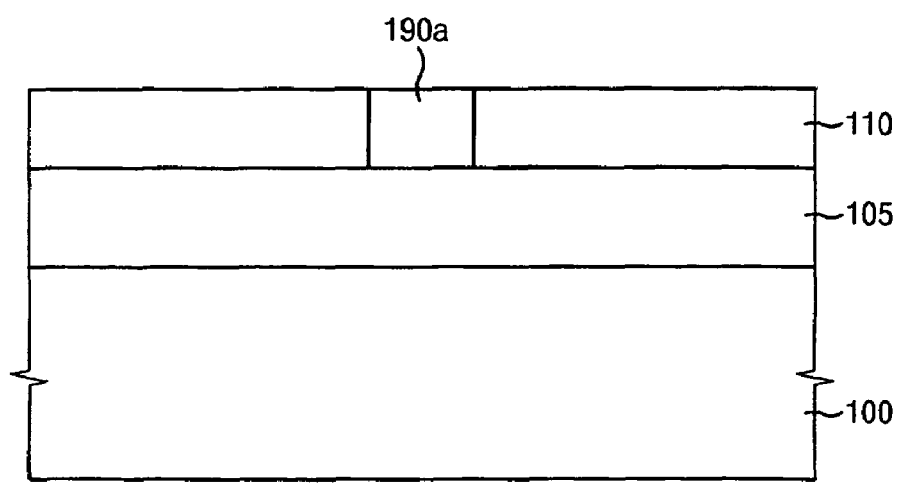

Referring to FIGS. 6B and 7B, the polysilicon layer 190 is partially removed until the first oxide layer 110 by a CMP process, an etch back process or a combination process of CMP and etch back. Thus, the semiconductor layer 190a having a level upper face is formed in the opening 115. The semiconductor layer 190a may have a height substantially identical to that of the first oxide layer 110.

Figure 6C:
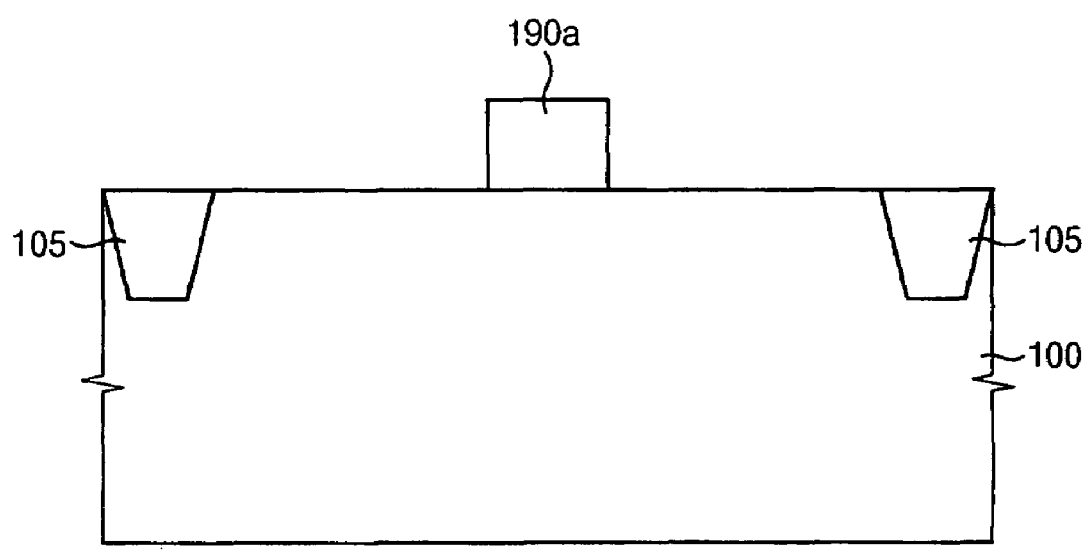
Figure 7C:
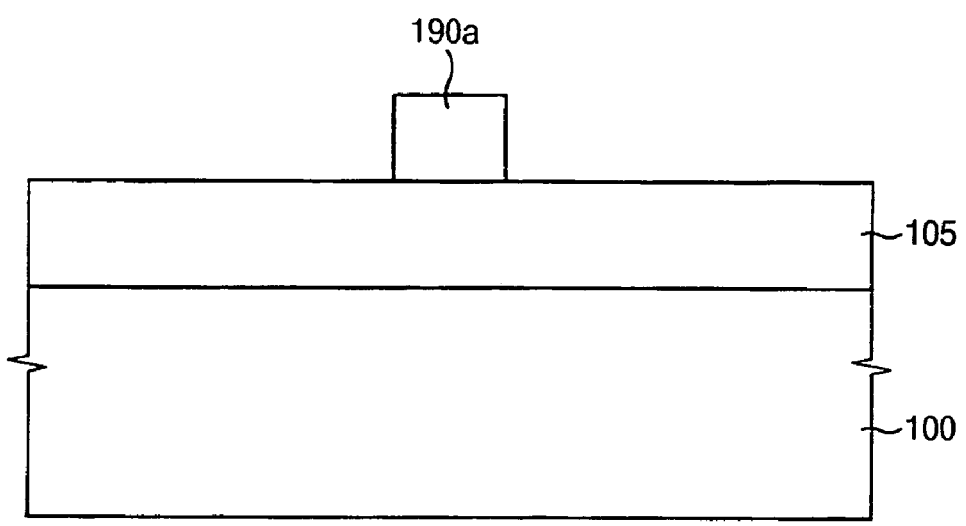

Referring to FIGS. 6C and 7C, the first oxide layer 110 is removed from the substrate 100. The first oxide layer 110 may be removed by a wet etching process using an etching solution that includes hydrogen fluoride. Therefore, the semiconductor layer 190a having a mesa structure is formed on the substrate 100.

According to the present invention, a semiconductor device includes gate electrodes and asymmetric source and drain regions by employing a semiconductor layer structure. The semiconductor device therefore prevents a short channel effect from occurring therein, even though the gate electrodes have dimensions of a scale on the order of nanometers. Additionally, the gate electrodes and asymmetric source and drain regions of the semiconductor device may be precisely formed to have dimensions on the nanometer scale because the semiconductor layer structure is used in the process for manufacturing the semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor device comprising:
    forming a semiconductor layer structure on a substrate;
    forming first spacers on both sidewalls of the semiconductor layer structure;
    forming gate electrodes on sidewalls of the first spacers, respectively;
    forming lightly doped source regions at first portions of the substrate adjacent to the semiconductor layer structure by implanting first impurities into the first portions of the substrate using the semiconductor layer structure, the first spacers and the gate electrodes as masks;
    forming halo regions adjacent to the lightly doped source regions beneath the gate electrodes by implanting second impurities into second portions of the substrate beneath the gate electrodes using the semiconductor layer structure, the first spacers and the gate electrodes as masks;
    forming second spacers on sidewalls of the gate electrodes, respectively;
    forming heavily doped source regions and a highly doped drain region by implanting third impurities using the first spacers, the gate electrodes and the second spacers as masks, the heavily doped drain region being formed in the semiconductor layer structure and the heavily doped source regions being adjacent to the lightly doped source regions; and
    forming a lightly doped drain region beneath the semiconductor layer structure by thermally treating the substrate to diffuse the third impurities in the heavily doped drain region into the substrate.

2. The method of claim 1, wherein the semiconductor layer structure comprises single crystalline silicon.

3. The method of claim 2, wherein forming the semiconductor layer structure comprises:
    forming an insulation layer on the substrate;
    forming an opening partially exposing the substrate by partially etching the insulation layer;
    forming a single crystalline silicon layer in the opening on the insulation layer by a selective epitaxial growth (SEG) process;
    forming the semiconductor layer structure in the opening by planarizing the single crystalline silicon layer; and
    removing the insulation layer using an etching solution including hydrogen fluoride.

4. The method of claim 3, wherein the single crystalline silicon layer has a thickness of about 100 to about 10,000 Å.

5. The method of claim 3, wherein the SEG process is carried out using a chemical vapor deposition (CVD) chamber, a rapid thermal chemical vapor deposition (RTCVD) process chamber or an atomic layer deposition (ALD) chamber.

6. The method of claim 3, wherein the SEG process is carried out at a temperature of about 700 to about 900° C. under a pressure of about 5 to about 10 Torr.

7. The method of claim 1, wherein the semiconductor layer structure comprises polysilicon.

8. The method of claim 7, wherein forming the semiconductor layer structure comprises:

forming an insulation layer on the substrate;
forming an opening partially exposing the substrate by partially etching the insulation layer;
forming a polysilicon layer in the opening on the insulation layer;
forming the semiconductor layer structure in the opening by planarizing the polysilicon layer; and
removing the insulation layer using an etching solution including hydrogen fluoride.

9. The method of claim 8, wherein the polysilicon layer has a thickness of about 100 to about 10,000 Å.

10. The method of claim 8, wherein the polysilicon layer is formed by a chemical vapor deposition (CVD) process, a rapid thermal chemical vapor deposition (RTCVD) process or an atomic layer deposition (ALD) process.

11. The method of claim 8, wherein the polysilicon layer is formed at a temperature of about 700 to about 900° C. under a pressure of about 5 to about 10 Torr.

12. The method of claim 1, further comprising forming an isolation pad on an end portion of the semiconductor layer structure together with the first spacers.

13. The method of claim 12, further comprising forming a gate electrode pad on a portion of the isolation pad together with the gate electrodes.

14. The method of claim 1, wherein the thermal treatment of the substrate is performed at a temperature of about 850 to about 1,050° C. for about 5 to about 200 seconds by a rapid thermal annealing (RTA) process.

15. The method of claim 1, wherein the substrate comprises a P type silicon substrate having an N type well, and the first, second, and third impurities comprise arsenic (As), boron (B) and arsenic (As), respectively.

16. The method of claim 15, wherein the first impurities are implanted with a concentration of about $1.0 \times 10^{13}$ to about $1.0 \times 10^{15}$ atoms/cm$^2$ and an energy of below about 30 KeV.

17. The method of claim 15, wherein the second impurities are implanted with a concentration of about $1.0 \times 10^{13}$ to about $1.0 \times 10^{15}$ atoms/cm$^2$ and an energy of below about 30 KeV.

18. The method of claim 15, wherein the third impurities are implanted with a concentration of about $1.0 \times 10^{13}$ to about $1.0 \times 10^{15}$ atoms/cm$^2$ and an energy of about 1 to about 100 KeV.

19. The method of claim 1, wherein the substrate comprises a P type silicon substrate having an N type well, and the first, second, and third impurities comprise boron fluoride (BF$_2$), arsenic (As) and boron (B), respectively.

20. The method of claim 19, wherein the first impurities are implanted with a concentration of about $1.0 \times 10^{14}$ to about $1.0 \times 10^{16}$ atoms/cm$^2$ and an energy of below about 30 KeV.

21. The method of claim 19, wherein the second impurities are implanted with a concentration of about $1.0 \times 10^{13}$ to about $1.0 \times 10^{15}$ atoms/cm$^2$ and an energy of below about 100 KeV.

22. The method of claim 19, wherein the third impurities are implanted with a concentration of about $1.0 \times 10^{14}$ to about $1.0 \times 10^{16}$ atoms/cm$^2$ and an energy of about 1 to about 30 KeV.

* * * * *